(12) United States Patent
Lin et al.

(10) Patent No.: US 8,409,926 B2
(45) Date of Patent: Apr. 2, 2013

(54) SEMICONDUCTOR DEVICE AND METHOD OF FORMING INSULATING LAYER AROUND SEMICONDUCTOR DIE

(75) Inventors: Yaojian Lin, Singapore (SG); Kang Chen, Singapore (SG); Jianmin Fang, Singapore (SG); Xia Feng, Singapore (SG); Xusheng Bao, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 238 days.

(21) Appl. No.: 12/720,057

(22) Filed: Mar. 9, 2010

(65) Prior Publication Data

US 2011/0221041 A1    Sep. 15, 2011

(51) Int. Cl.
*H01L 23/28* (2006.01)
*H01L 21/56* (2006.01)

(52) U.S. Cl. .................. 438/113; 257/723; 257/E21.7; 257/E21.705; 257/E23.126

(58) Field of Classification Search .................. None
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,841,193 A | 11/1998 | Eichelberger | |
| 6,214,703 B1 * | 4/2001 | Chen et al. | 438/462 |
| 6,271,469 B1 | 8/2001 | Ma et al. | |
| 6,686,225 B2 * | 2/2004 | Wachtler | 438/114 |
| 7,129,114 B2 * | 10/2006 | Akram | 438/110 |
| 7,170,152 B2 | 1/2007 | Huang et al. | |
| 7,323,778 B2 | 1/2008 | Shizuno | |
| 7,335,576 B2 * | 2/2008 | David et al. | 438/462 |
| 7,485,562 B2 * | 2/2009 | Chua et al. | 438/613 |
| 7,557,437 B2 | 7/2009 | Yang et al. | |
| 7,619,901 B2 | 11/2009 | Eichelberger et al. | |
| 7,622,733 B2 * | 11/2009 | Fuergut et al. | 257/40 |
| 2006/0030078 A1 * | 2/2006 | Jiang et al. | 438/113 |
| 2006/0160269 A1 * | 7/2006 | Rajagopalan et al. | 438/106 |
| 2007/0087524 A1 * | 4/2007 | Montgomery | 438/427 |
| 2009/0042366 A1 * | 2/2009 | Grivna | 438/460 |
| 2009/0152715 A1 * | 6/2009 | Shim et al. | 257/737 |

(Continued)

OTHER PUBLICATIONS

Lizotte, T.; , "Laser dicing of chip scale and silicon wafer scale packages," Electronics Manufacturing Technology Symposium, 2003. IEMT 2003. IEEE/CPMT/SEMI 28th International , vol., No., pp. 1-5, Jul. 16-18, 2003.*

(Continued)

*Primary Examiner* — Thomas L Dickey
*Assistant Examiner* — Joseph Schoenholtz
(74) *Attorney, Agent, or Firm* — Robert D. Atkins; Patent Law Group: Atkins & Associates, P.C.

(57) ABSTRACT

A plurality of semiconductor die is mounted to a temporary carrier. An encapsulant is deposited over the semiconductor die and carrier. A portion of the encapsulant is designated as a saw street between the die, and a portion of the encapsulant is designated as a substrate edge around a perimeter of the encapsulant. The carrier is removed. A first insulating layer is formed over the die, saw street, and substrate edge. A first conductive layer is formed over the first insulating layer. A second insulating layer is formed over the first conductive layer and first insulating layer. The encapsulant is singulated through the first insulating layer and saw street to separate the semiconductor die. A channel or net pattern can be formed in the first insulating layer on opposing sides of the saw street, or the first insulating layer covers the entire saw street and molding area around the semiconductor die.

24 Claims, 13 Drawing Sheets

U.S. PATENT DOCUMENTS

2009/0294928 A1* 12/2009 Kim et al. .................... 257/659

OTHER PUBLICATIONS

Xuejun Fan; , "Wafer level packaging (WLP): Fan-in, fan-out and three-dimensional integration," Thermal, Mechanical & Multi-Physics Simulation, and Experiments in Microelectronics and Microsystems (EuroSimE), 2010 11th International Conference on , vol., No., pp. 1-7, Apr. 26-28, 2010.*

Brunnbauer, M.; Furgut, E.; Beer, G.; Meyer, T.; , "Embedded wafer level ball grid array (eWLB)," Electronics Packaging Technology Conference, 2006. EPTC '06. 8th , vol., No., pp. 1-5, Dec. 6-8, 2006.*

Th, E.K.; Hao, J.Y.; Ding, J.P.; Li, Q.F.; Chan, W.L.; Ho, S.C.; Huang, H.M.; Jiang, Y.J.; , "Encapsulation challenges for wafer level packaging," Electronics Packaging Technology Conference, 2009. EPTC '09. 11th , vol., No., pp. 903-908, Dec. 9-11, 2009.*

Vijchulata, P.; , "Unique fiducial designs for CSP singulation process," Electronics Manufacturing Technology Symposium, 2003. IEMT 2003. IEEE/CPMT/SEMI 28th International , vol., No., pp. 7-12, Jul. 16-18, 2003.*

Tessier, T.G.; Shin, W.S.; Yuen, Y.K.; Do, B.T.; Kuan, F.; Ling, J.; , "WLCSP back-end considerations," Electronics Manufacturing Technology Symposium, 2003. IEMT 2003. IEEE/CPMT/SEMI 28th International , vol., No., pp. 181-185, Jul. 16-18, 2003.*

Hunt, J.R.; , "Backend processing for wafer level chip scale packaging," Electronics Manufacturing Technology Symposium, 2003. IEMT 2003. IEEE/CPMT/SEMI 28th International , vol., No., pp. 187-193, Jul. 16-18, 2003.*

Paydenkar, C.; Poddar, A.; Chandra, H.; Harada, S.; , "Wafer sawing process characterization for thin die (75micron) applications," Electronics Manufacturing Technology Symposium, 2004. IEEE/CPMT/SEMI 29th International , vol., No., pp. 74-77, Jul. 14-16, 2004.*

Ganesh, V.P.; Lee, C.; , "Overview and emerging challenges in mechanical dicing of silicon wafers," Electronics Packaging Technology Conference, 2006. EPTC '06. 8th , vol., No., pp. 15-21, Dec. 6-8, 2006.*

Ganesh, V.P.; Bahr, A.; , "Silicon chip separation: Meeting demands of chip embedding packaging technology—eWLB," Electronics Packaging Technology Conference (EPTC), 2010 12th , vol., No., pp. 517-519, Dec. 8-10, 2010.*

Koh Wen Shi; Yow, K.Y.; Khoo, R.; , "Investigations of the effects of blade type, dicing tape, blade preparation and process parameters on 55nm node low-k wafer," Electronic Manufacturing Technology Symposium (IEMT), 2010 34th IEEE/CPMT International , vol., No., pp. 1-6, Nov. 30-Dec. 2, 2010.*

Amri, M.S.; Liew, D.; Harun, F.; , "Chipping free process for combination of narrow saw street (60um) and thick wafer (600um) sawing process," Electronic Manufacturing Technology Symposium (IEMT), 2010 34th IEEE/CPMT International , vol., No., pp. 1-5, Nov. 30-Dec. 2, 2010.*

Marks, M. R. "Novel Deprocessing Technique for Failure Analysis of Flip-chip Integrated Circuit Packages." Journal of Failure Analysis and Prevention 1 (Dec. 29, 2001): 45-52.*

* cited by examiner

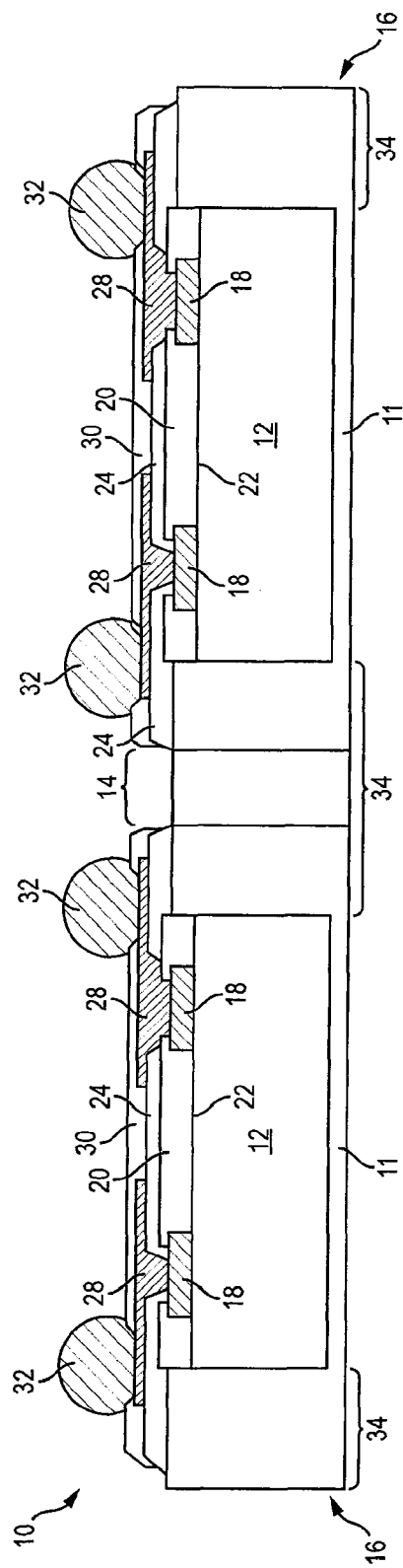
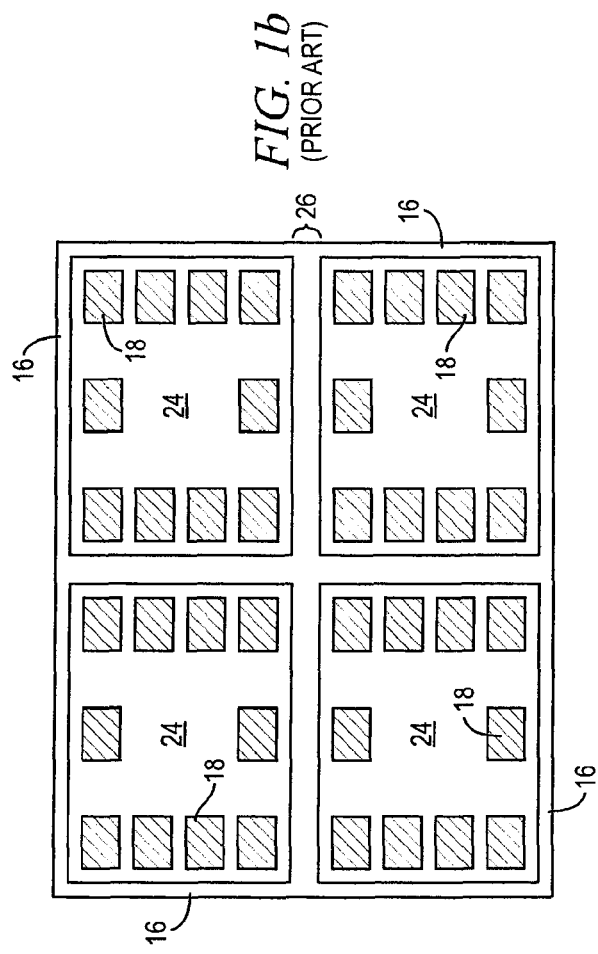
FIG. 1a (PRIOR ART)
FIG. 1b (PRIOR ART)

SEMICONDUCTOR DEVICE AND METHOD OF FORMING INSULATING LAYER AROUND SEMICONDUCTOR DIE

FIELD OF THE INVENTION

The present invention relates in general to semiconductor devices and, more particularly, to a semiconductor device and method of forming an insulating layer around semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIG. 1a shows a conventional semiconductor wafer 10 with a plurality of semiconductor die 12 formed on substrate 11 and separated by saw street 14 and wafer edge 16. Contact pads 18 and dielectric layer 20 are formed over active surface 22 of semiconductor die 12. A passivation layer 24 is formed over dielectric layer 20. However, saw street 14 designated for singulation and wafer edge 16 are devoid of passivation. FIG. 1b shows a top view of passivation layer 24 absent over saw street 14 and wafer edge 16. A redistribution layer (RDL) 28 is formed over passivation layer 24 to extend the electrical connectivity of contact pads 18. A passivation layer 30 is formed over passivation layer 24 and RDL 28. Bumps 32 are formed at least partially over molding area 34 and electrically connected to RDL 28. The edge pads in a fan-out wafer level chip scale package (FO-WLCSP) tend to have unstable contact resistance, particularly when formed in PVD. In addition, out-gassing from molding area 34 of the FO-WLCSP in PVD is known to effect plasma stability in oxide etching.

SUMMARY OF THE INVENTION

A need exists for a stable contact resistance and plasma during oxide etching in a FO-WLCSP. Accordingly, in one embodiment, the present invention is a method of making a semiconductor device comprising the steps of providing a temporary carrier, mounting a plurality of semiconductor die with contact pads oriented to the temporary carrier, and depositing an encapsulant over the semiconductor die and temporary carrier. A portion of the encapsulant is designated as a saw street between the semiconductor die, and a portion of the encapsulant is designated as a substrate edge around a perimeter of the encapsulant. The method further includes the steps of removing the temporary carrier, forming a first insulating layer over the semiconductor die, saw street, and substrate edge, forming a first conductive layer over the first insulating layer and electrically connected to the contact pads, forming a second insulating layer over the first conductive layer and first insulating layer, and singulating the encapsulant through the first insulating layer and saw street to separate the semiconductor die.

In another embodiment, the present invention is a method of making a semiconductor device comprising the steps of providing a carrier, mounting semiconductor die to the carrier, and depositing an encapsulant over the semiconductor die and carrier. A portion of the encapsulant is designated as a saw street between the semiconductor die. The method further includes the steps of removing the carrier, forming a first insulating layer over the semiconductor die and saw street, forming a first conductive layer over the first insulating layer, forming a second insulating layer over the first conductive layer and first insulating layer, and singulating the encapsulant through the first insulating layer and saw street into the semiconductor die.

In another embodiment, the present invention is a method of making a semiconductor device comprising the steps of providing a plurality of semiconductor die, and depositing an encapsulant over the semiconductor die. A portion of the encapsulant is designated as a saw street between the semiconductor die. The method further includes the steps of forming a first insulating layer over the semiconductor die and saw street, forming an RDL over the first insulating layer, and singulating the encapsulant through the first insulating layer and saw street into the semiconductor die.

In another embodiment, the present invention is a semiconductor device comprising a plurality of semiconductor die and encapsulant deposited over the semiconductor die. A portion of the encapsulant is designated as a saw street between the semiconductor die. A first insulating layer is formed over the semiconductor die and saw street. A first conductive layer is formed over the first insulating layer. A second insulating layer is formed over the first conductive layer and first insulating layer. The encapsulant is singulated through the first insulating layer and saw street into the semiconductor die.

BRIEF DESCRIPTION OF THE DRAWINGS

FIGS. 1a-1b illustrate a conventional semiconductor wafer with no passivation over saw street or wafer edge;

DETAILED DESCRIPTION OF THE DRAWINGS

Figure 2:
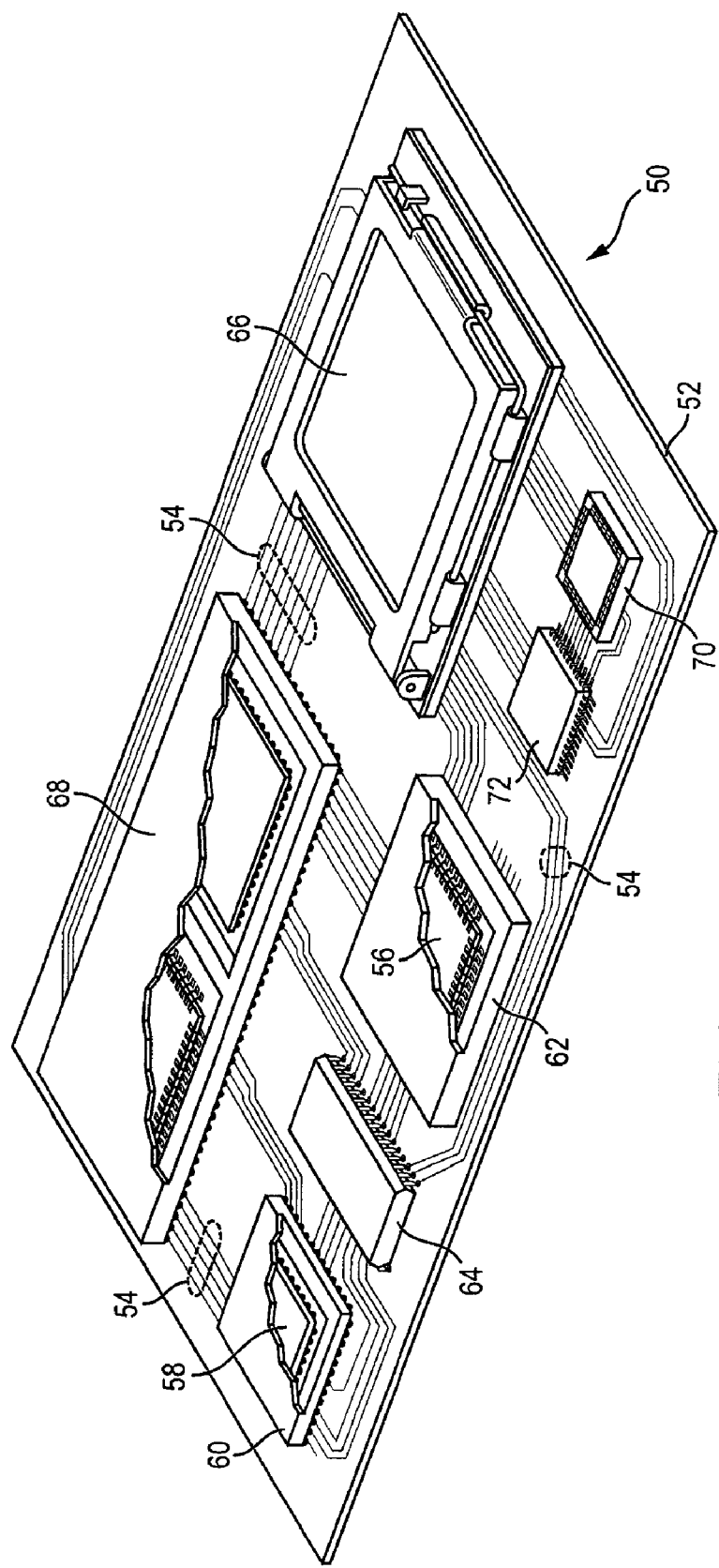
FIG. 2 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer.

The semiconductor package can include microprocessors, memories, application specific integrated circuits (ASIC), logic circuits, analog circuits, RF circuits, discrete devices, or other semiconductor die or electrical components.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
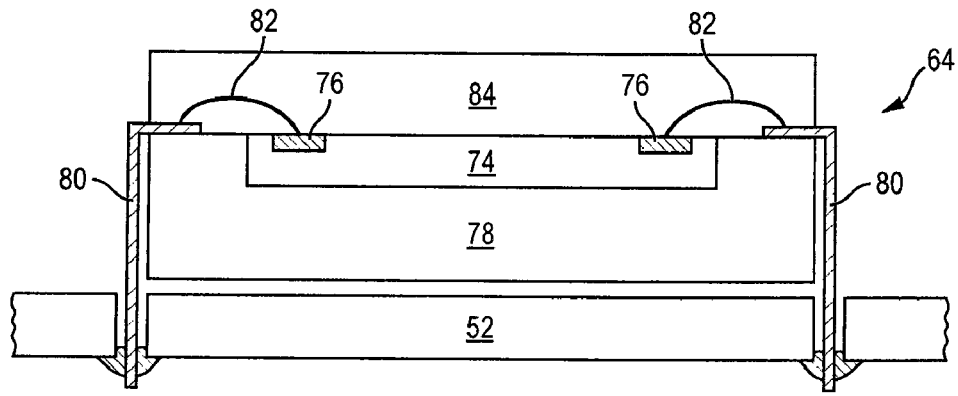
FIGS. 3a-3c illustrate further detail of the representative semiconductor packages mounted to the PCB.
Figure 3B:
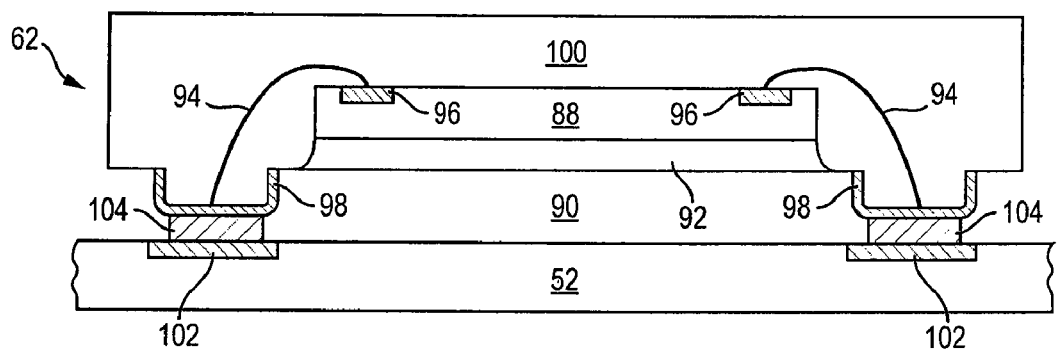
Figure 3C:
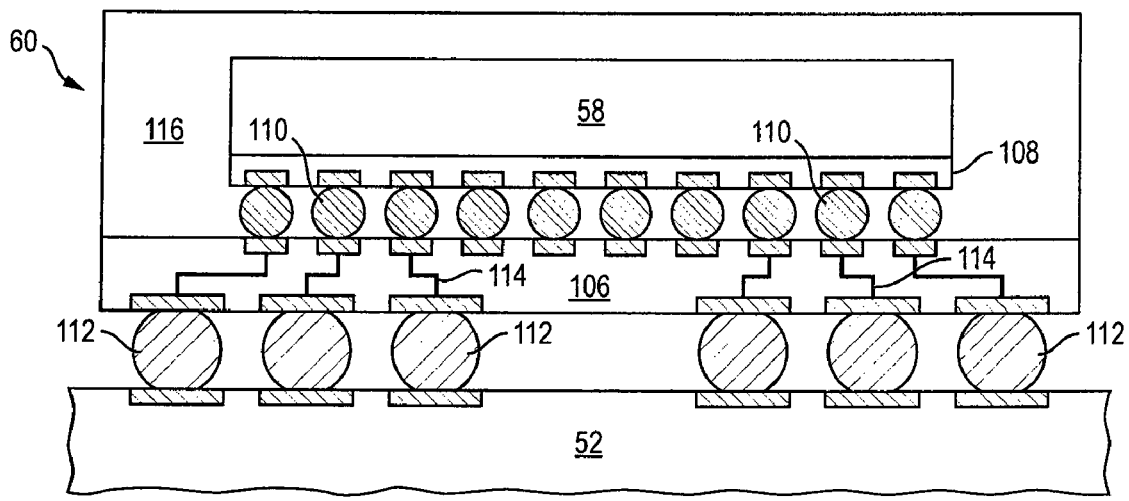

FIGS. 3*a*-3*c* show exemplary semiconductor packages. FIG. 3*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3*b* illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3*c*, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4A:
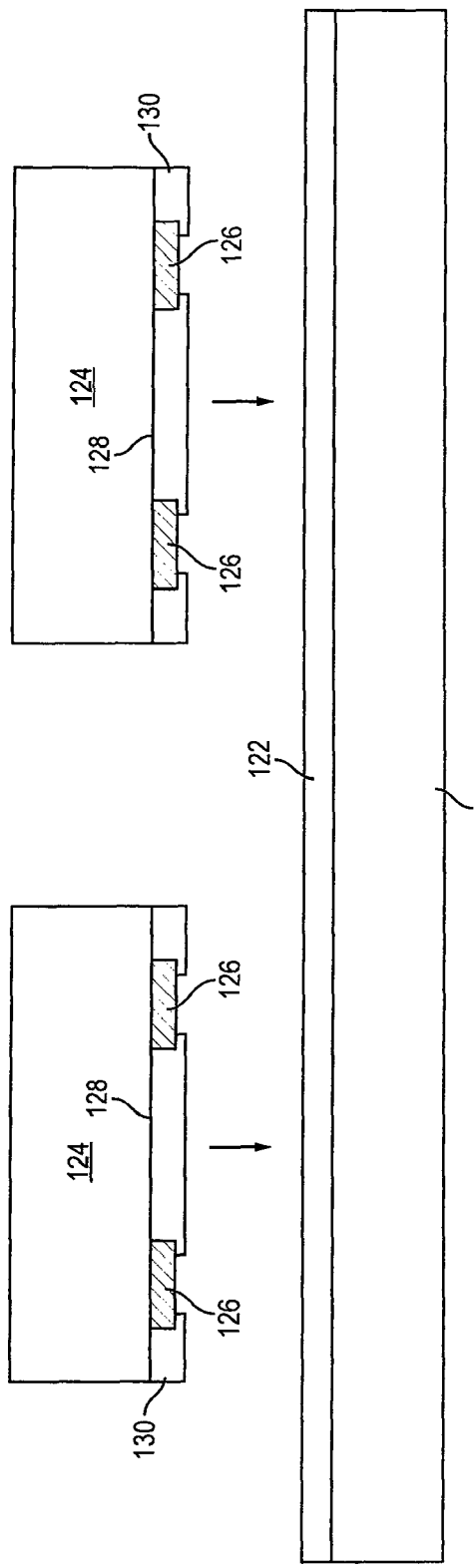
FIGS. 4a-4h illustrate a process of forming an insulating layer over the saw street and around the substrate edge.

FIGS. 4*a*-4*h* illustrate, in relation to FIGS. 2 and 3*a*-3*c*, a process of forming an insulating layer over the saw street and around the substrate edge. In FIG. 4*a*, a substrate or carrier 120 contains temporary or sacrificial base material such as silicon, polymer, polymer composite, metal, ceramic, glass, glass epoxy, beryllium oxide, or other suitable low-cost, rigid material for structural support. An interface layer or tape 122 is applied over carrier 120 as a temporary adhesive or bonding layer releasable with ultra-violet (UV) light or heat.

Semiconductor die 124 are mounted to adhesive tape 122 with contact pads 126 and active surface 128 oriented toward carrier 120. Active surface 128 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An insulating or dielectric layer 130 is formed over active surface 128 and contact pads 126 using PVD, CVD, printing, spin coating, spray coating, or thermal oxidation. The insulating layer 130 can be one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable dielectric material. A portion of insulating layer 130 is removed by an etching process to expose contact pads 126.

Figure 4B:
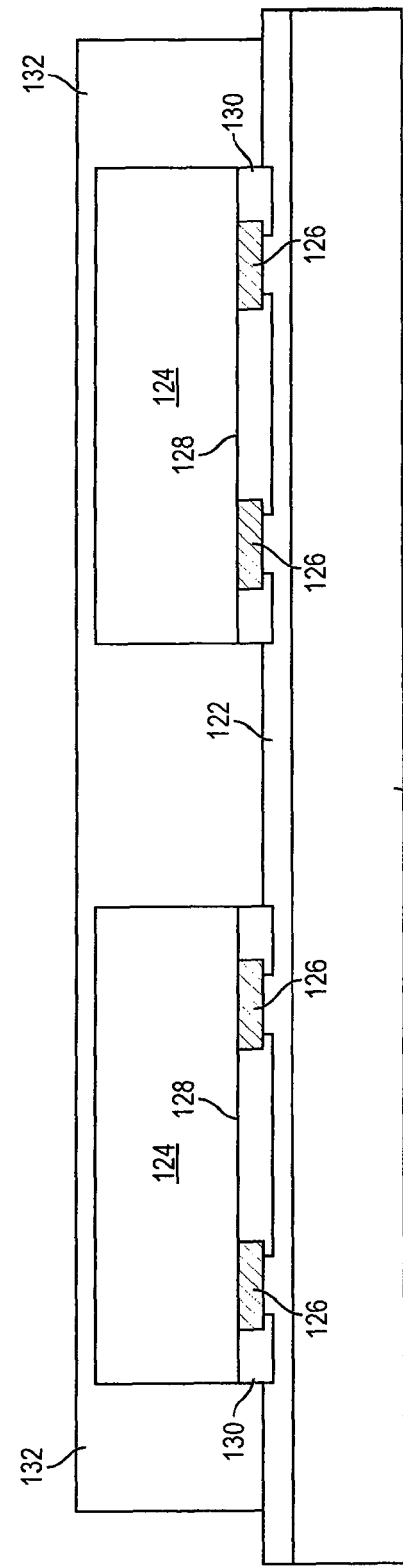

FIG. 4b shows semiconductor die 124 mounted to adhesive tape 122. An encapsulant or molding compound 132 is deposited over carrier 120 and semiconductor die 124 using a paste printing, compressive molding, transfer molding, liquid encapsulant molding, vacuum lamination, spin coating, or other suitable applicator. Encapsulant 132 can be polymer composite material, such as epoxy resin with filler, epoxy acrylate with filler, or polymer with proper filler. Encapsulant 132 is non-conductive and environmentally protects the semiconductor device from external elements and contaminants.

Figure 4C:
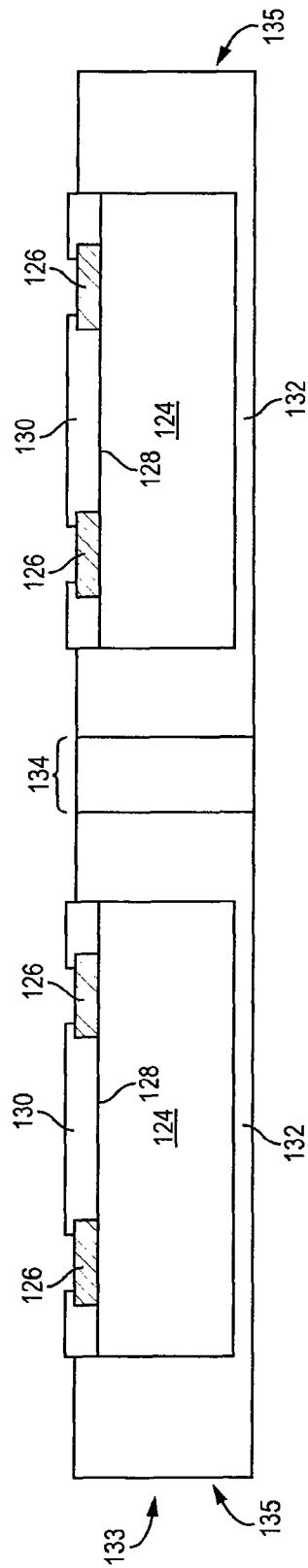

In FIG. 4c, carrier 120 and adhesive tape 122 are removed by chemical etching, mechanical peel-off, CMP, mechanical grinding, thermal bake, laser scanning, wet stripping, UV light, or heat. Semiconductor die 124 remain embedded with encapsulant 132 which operates as substrate 133 with embedded or caved die. Saw street 134 defines an area for later singulation operation. Substrate edge 135 defines a perimeter of the substrate.

Figure 4D:
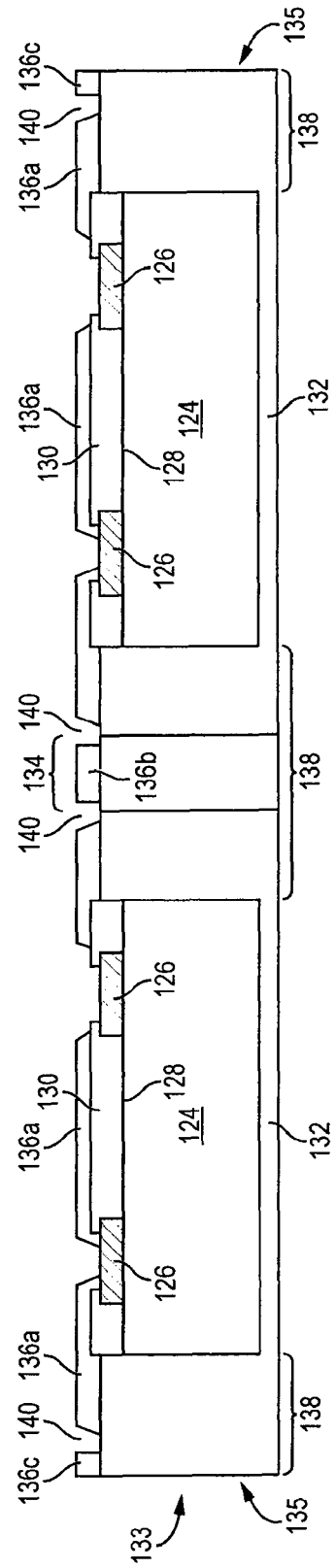

In FIG. 4d, an insulating or passivation layer 136 is formed over substrate 133 by PVD, CVD, printing, spin coating, spray coating, or thermal oxidation. The insulating layer 136 can be one or more layers of SiO2, Si3N4, SiON, Ta2O5, Al2O3, or other material having similar insulating and structural properties. In particular, insulating layer 136a covers contact pads 126, insulating layer 130, and molding area 138 designated for interconnect fan-out. A portion of insulating layer 136a is removed by an etching process to expose contact pads 126. The etching process also creates a gap or channel 140 in the insulating layer on opposing sides of saw street 134 which defines insulating layer 136b over the saw region designated for singulation. Channel 140 further defines insulating layer 136c along substrate edge 135.

Figure 4E:
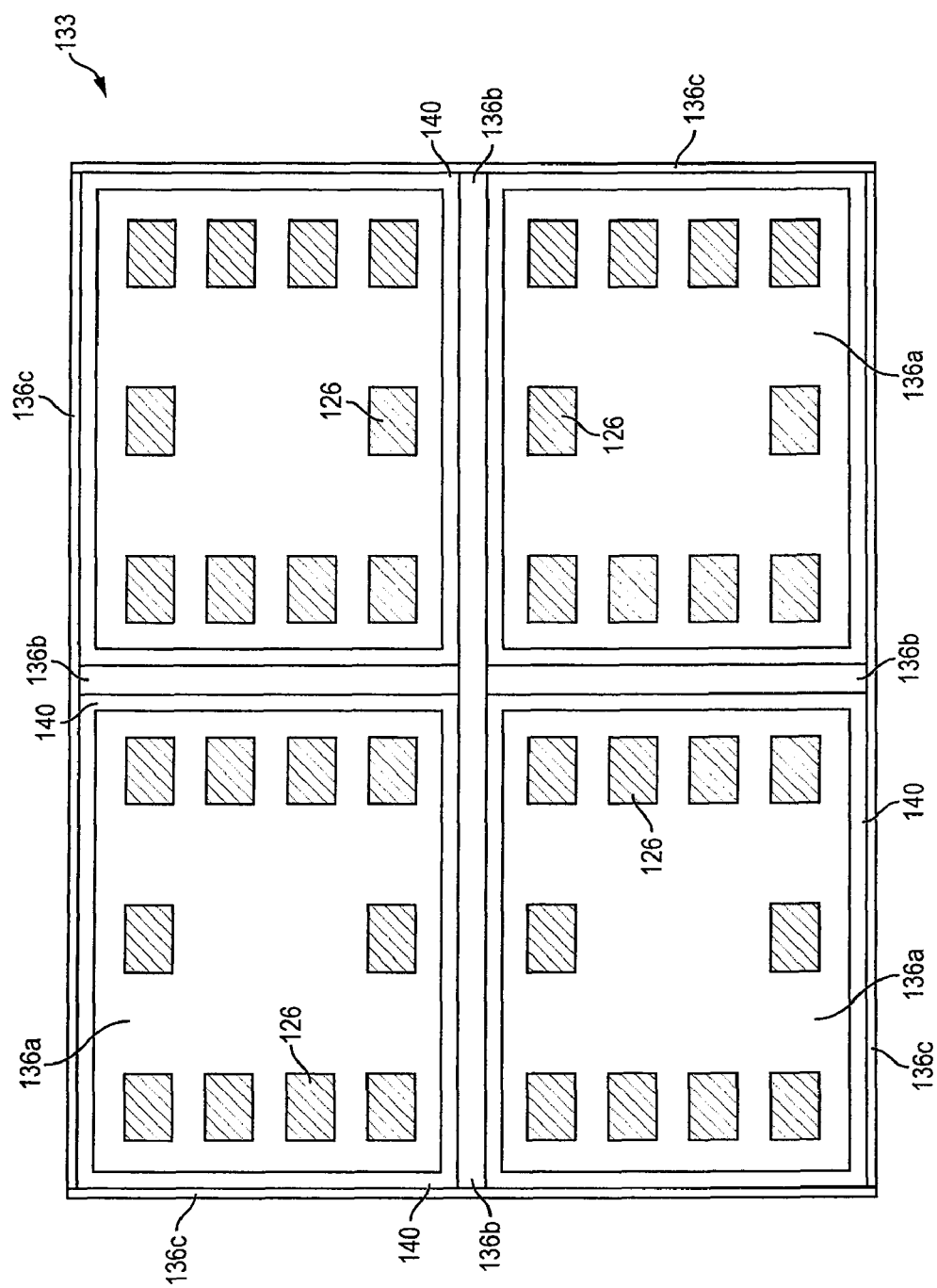

FIG. 4e is a top view of insulating layer 136 over substrate 133. In one embodiment, channel 140 is 10-30 micrometers wide. The insulating layer 136b and 136c partially covers saw street 134 and substrate edge 135. Channel 140 extends to the package passivation edge to minimize the front side outgassing from molding surface 138. The insulating layer 136 also planarizes the surface for subsequent layers and secures the thickness of final passivation over contact pads 126 for bumping, which in turn controls the reliability of singulated die on a test board, particularly for corner bumps.

Figure 4F:
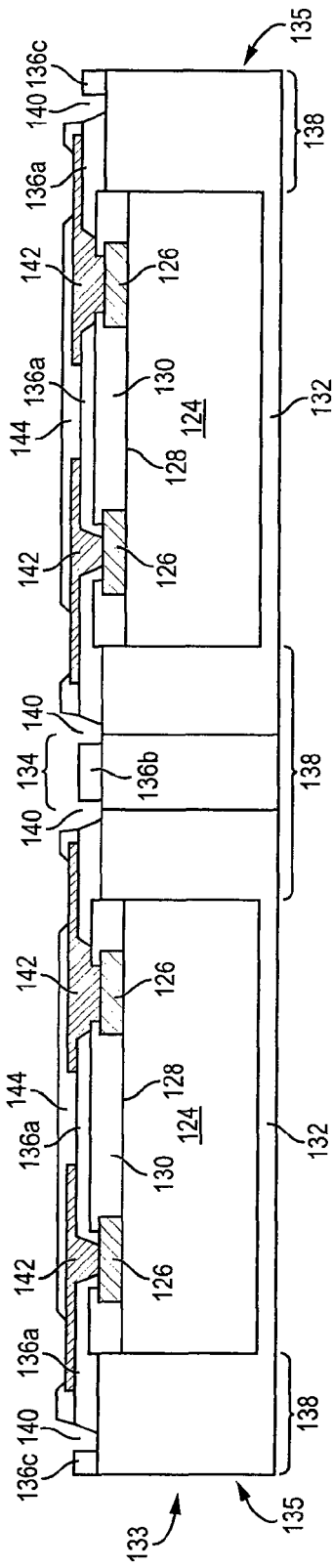

In FIG. 4f, an electrically conductive layer 142 is formed over insulating layer 136a and contact pads 126 using patterning and PVD, CVD, electrolytic plating, electroless plating process, or other suitable metal deposition process. Conductive layer 142 can be one or more layers of Al, Cu, Sn, Ni, Au, Ag, or other suitable electrically conductive material. Conductive layer 142 is electrically connected to contact pads 126 and operates as an RDL to extend the electrical connectivity of the contact pads. Additional RDL layers can be built up on the substrate.

An insulating or passivation layer 144 is formed over insulating layer 136a and RDL 142 by PVD, CVD, printing, spin coating, spray coating, or thermal oxidation. The insulating layer 144 can be one or more layers of SiO2, Si3N4, SiON, Ta2O5, Al2O3, or other material having similar insulating and structural properties. A portion of insulating layer 144 is removed by an etching process to expose RDL 142.

Figure 4G:
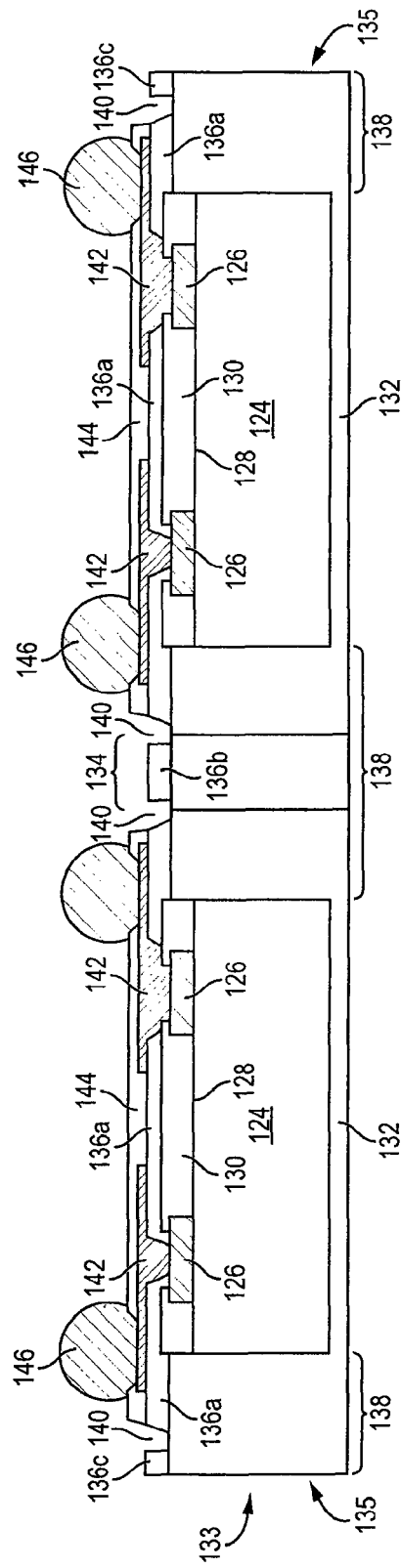

In FIG. 4g, an electrically conductive bump material is deposited over RDL 142 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to RDL 142 using a suitable attachment or bonding process. In one embodiment, the bump material is reflowed by heating the material above its melting point to form spherical balls or bumps 146 extending at least partially over molding area 138. In some applications, bumps 146 are reflowed a second time to improve electrical contact to RDL 142. The bumps can also be compression bonded to RDL 142. Bumps 146 represent one type of interconnect structure that can be formed over RDL 142. The interconnect structure can also use bond wires, stud bump, micro bump, or other electrical interconnect.

Figure 4H:
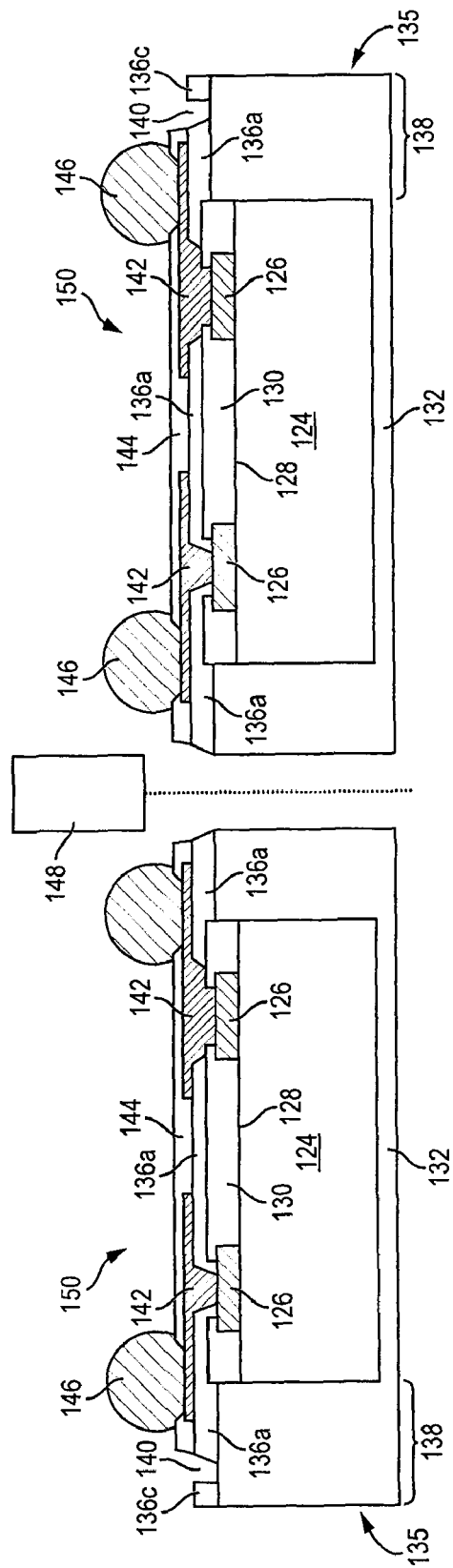

In FIG. 4h, substrate 133 is singulated through insulating layer 136 and saw street 134 using saw blade or laser cutting tool 148 to separate the individual semiconductor die 124 into FO-WLCSP 150. Saw blade or laser cutting tool 148 can use a single cut or step cut.

Figure 5:
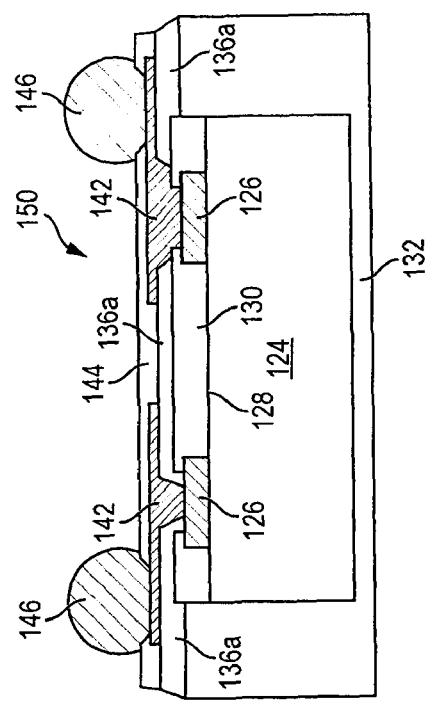
FIG. 5 illustrates the FO-WLCSP with an insulating layer formed over the saw street and around the substrate edge.

FIG. 5 shows FO-WLCSP 150 after singulation. Contact pads 132, RDL 142, and bumps 146 provide electrical connection to the circuits on active surface 130. The insulating layer 136 is formed prior to RDL 142 and covers saw street 134 and substrate edge 135, less channel 140, to reduce outgassing from molding area 138. The insulating layer 136 improves contact resistance in PVD for fan-out edge pads and plasma stability during oxide etching. The insulating layer 136 also reduces particles and other contaminants from molding area 138 during singulation.

Figure 6A:
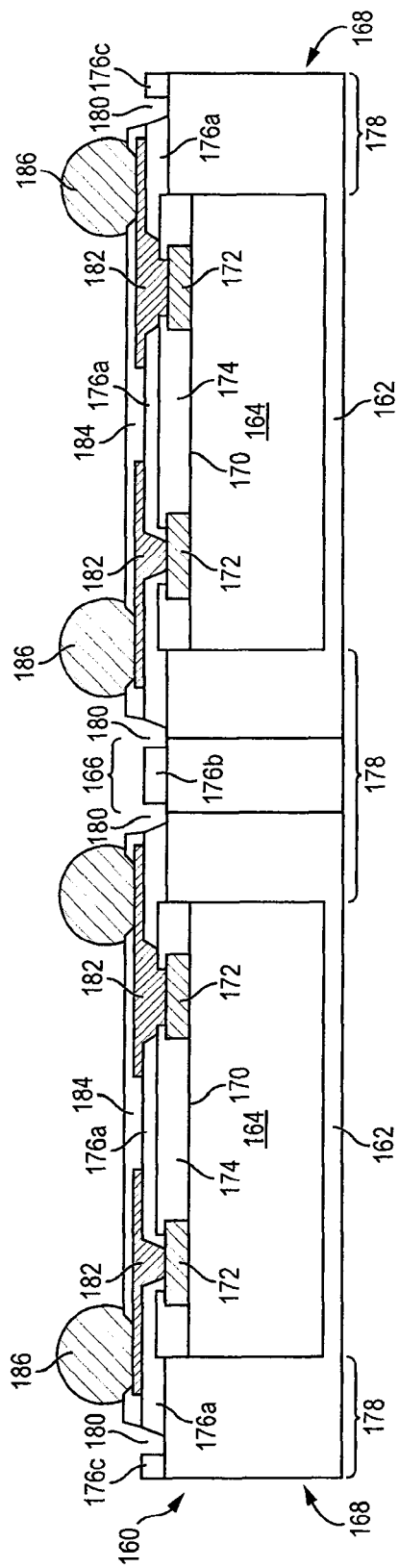
FIGS. 6a-6d illustrate an insulating layer in a net pattern over the saw street and around the substrate edge.

FIGS. 6a-6d illustrate, in relation to FIGS. 2 and 3a-3c, a process of forming an insulating layer in a net pattern over the saw street and around the substrate edge. FIG. 6a shows substrate 160 with embedded semiconductor die 164, similar to FIG. 4c. Semiconductor die 164 have active surface 170 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 170 to implement analog circuits or digital circuits, such as DSP, ASIC, memory, or other signal processing circuit. Semiconductor die 164 may also contain IPDs, such as inductors, capacitors, and resistors, for RF signal processing.

An insulating or dielectric layer 174 is formed over active surface 170 and contact pads 172 using PVD, CVD, printing, spin coating, spray coating, or thermal oxidation. The insulating layer 174 can be one or more layers of SiO2, Si3N4, SiON, Ta2O5, Al2O3, polyimide, BCB, PBO, or other suitable dielectric material. A portion of insulating layer 174 is removed by an etching process to expose contact pads 172.

An insulating or passivation layer 176 is formed in a net pattern over semiconductor wafer 160 by PVD, CVD, printing, spin coating, spray coating, or thermal oxidation. The insulating layer 176 can be one or more layers of SiO2, Si3N4, SiON, Ta2O5, Al2O3, or other material having similar insulating and structural properties. In particular, insulating layer 176a covers contact pads 172, insulating layer 174, and molding area 178 designated for interconnect fan-out. A portion of insulating layer 176a is removed by an etching process to expose contact pads 172. The etching process also creates net pattern 180 in the insulating layer on either side of saw street 166 which defines insulating layer 176b over saw street 166 designated for singulation. Net pattern 180 further defines insulating layer 176c along substrate edge 168. FIG. 6b is a top view of insulating layer 176 with a net pattern 180 over semiconductor wafer 160. In net pattern 180, some portions of insulating layer 176 extend between insulating layer 176a, and other portions of insulating layer 176 are broken by the net pattern. FIG. 6c shows further detail of net pattern 180 with alternating pattern of presence and absence of insulating layer 176. The insulating layer 176b and 176c, with net pattern 180, reduces out-gassing from molding area 178.

Returning to FIG. 6a, an electrically conductive layer 182 is formed over insulating layer 176a and contact pads 172 using patterning and PVD, CVD, electrolytic plating, electroless plating process, or other suitable metal deposition process. Conductive layer 182 can be one or more layers of Al, Cu, Sn, Ni, Au, Ag, or other suitable electrically conductive material. Conductive layer 182 is electrically connected to contact pads 172 and operates as an RDL to extend the electrical connectivity of the contact pads.

An insulating or passivation layer 184 is formed over insulating layer 176a and RDL 182 by PVD, CVD, printing, spin coating, spray coating, or thermal oxidation. The insulating layer 184 can be one or more layers of SiO2, Si3N4, SiON, Ta2O5, Al2O3, or other material having similar insulating and structural properties. A portion of insulating layer 184 is removed by an etching process to expose RDL 182.

An electrically conductive bump material is deposited over RDL 182 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to RDL 182 using a suitable attachment or bonding process. In one embodiment, the bump material is reflowed by heating the material above its melting point to form spherical balls or bumps 186 extending at least partially over molding area 178. In some applications, bumps 186 are reflowed a second time to improve electrical contact to RDL 182. The bumps can also be compression bonded to RDL 182. Bumps 186 represent one type of interconnect structure that can be formed over RDL 182. The interconnect structure can also use bond wires, stud bump, micro bump, or other electrical interconnect.

Figure 6D:
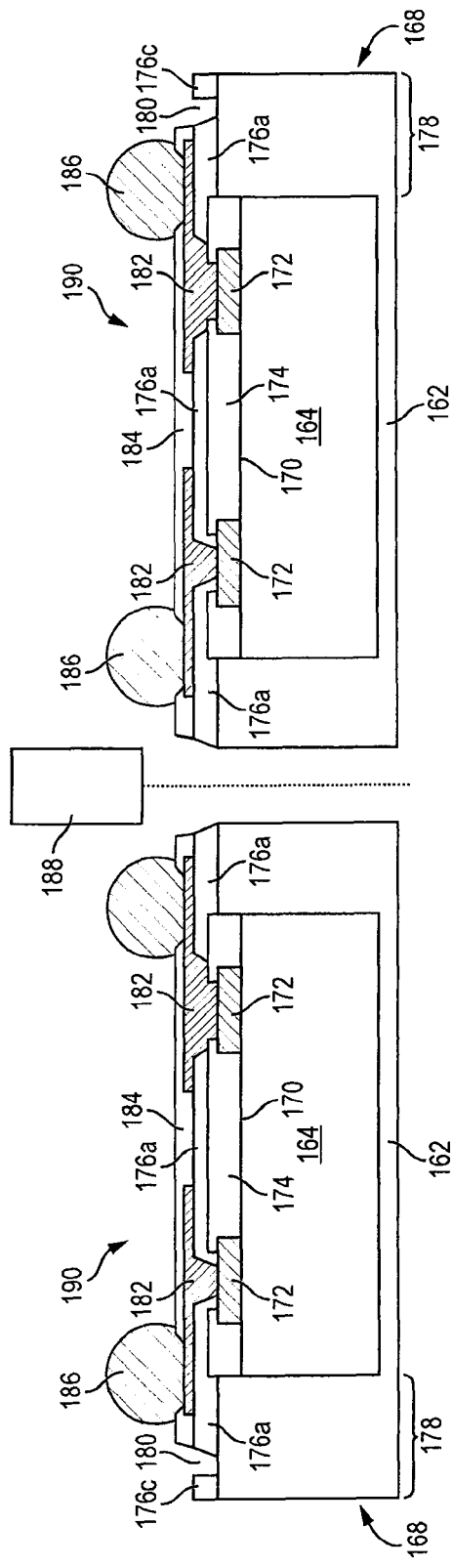
Figure 6B:
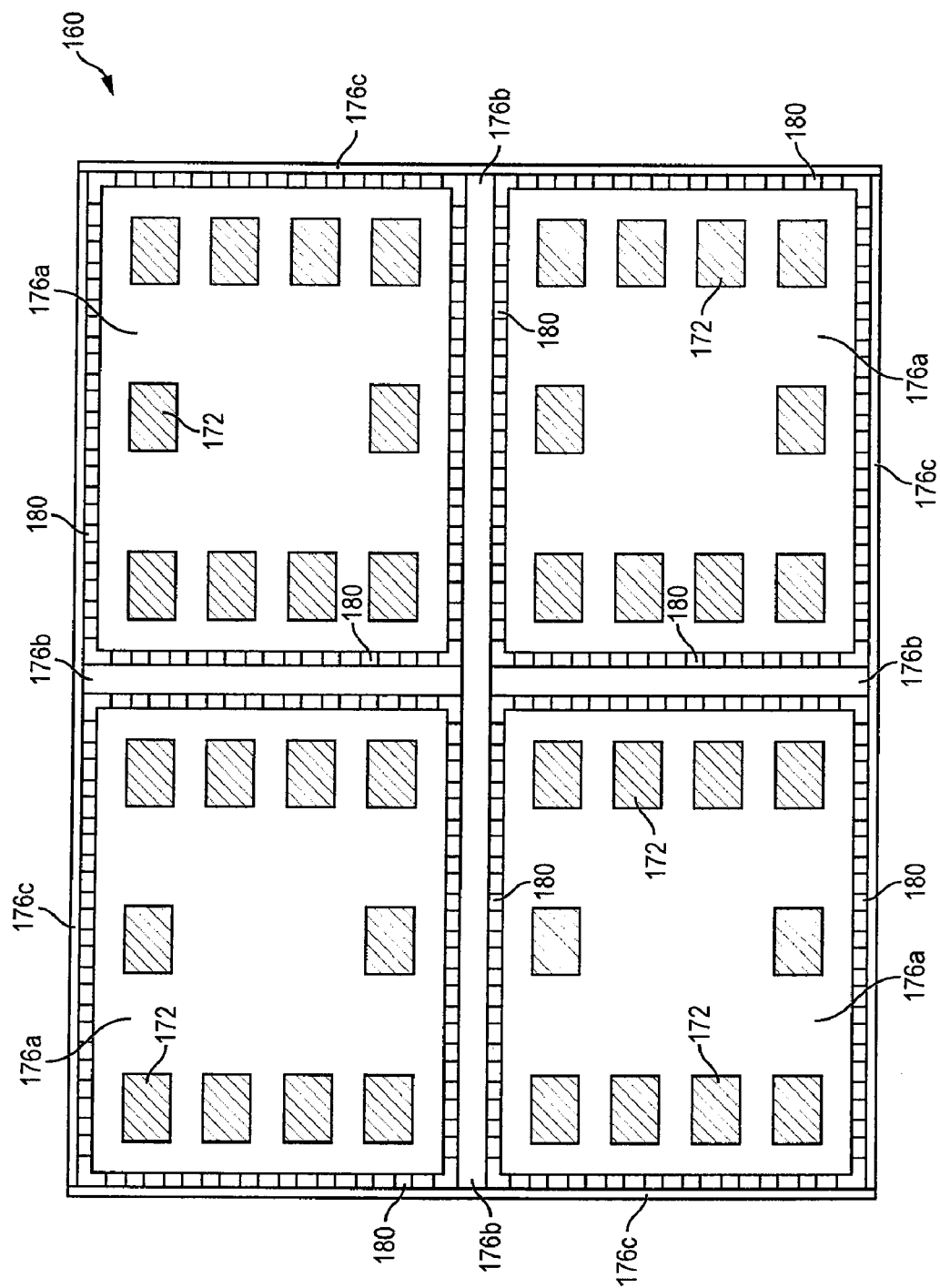
Figure 6C:
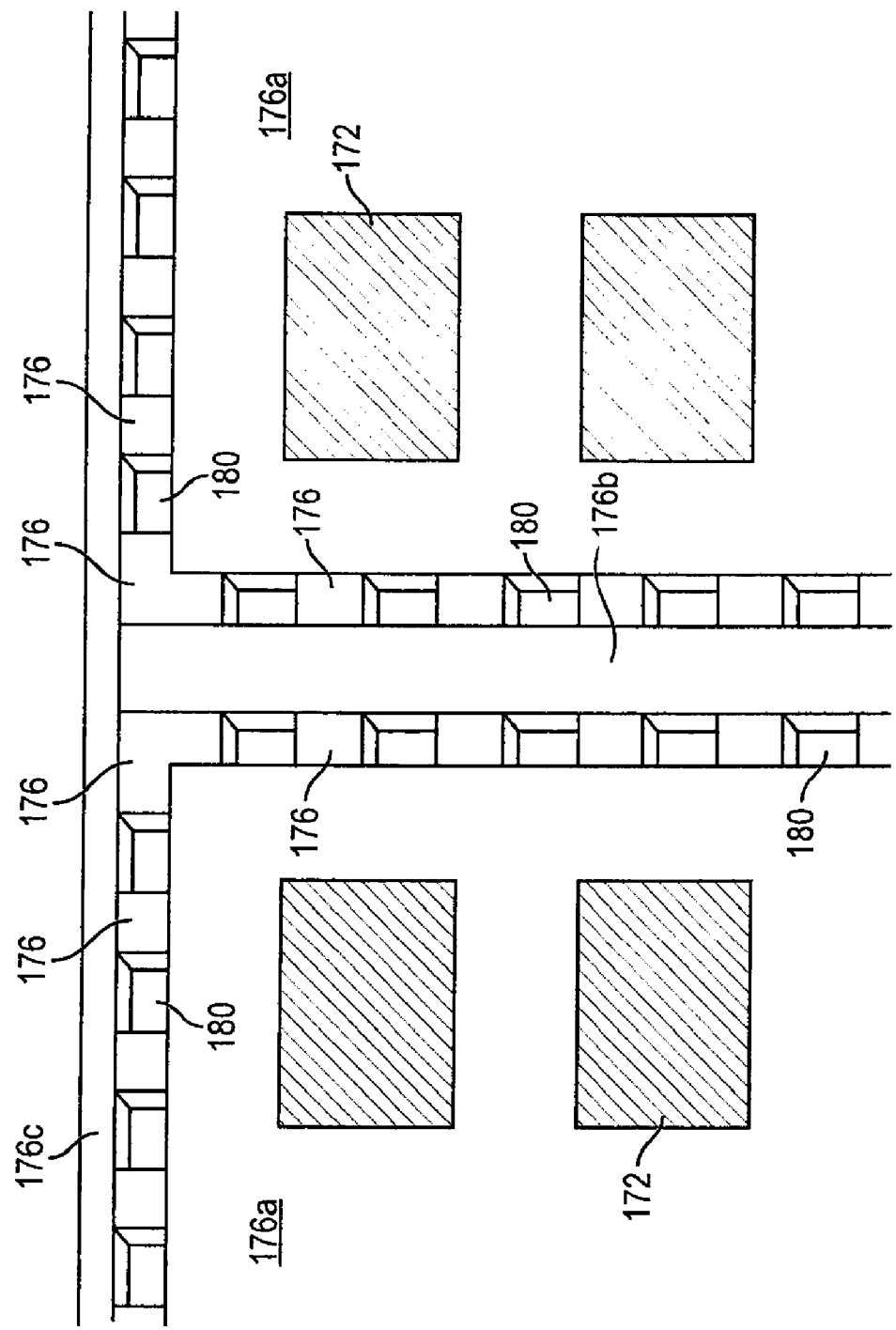

In FIG. 6d, semiconductor wafer 160 is singulated through insulating layer 176 and saw street 166 using saw blade or laser cutting tool 188 to separate the individual semiconductor die 164 into FO-WLCSP 190, similar to FIG. 5. Saw blade or laser cutting tool 188 can use a single cut or step cut. Contact pads 172, RDL 182, and bumps 186 provide electrical connection to the circuits on active surface 170. The insulating layer 176 is formed prior to RDL 182 and covers saw street 166 and substrate edge 168, less net pattern 180, to reduce out-gassing from molding area 178. The insulating layer 176 improves contact resistance in PVD for fan-out edge pads and plasma stability during oxide etching. The insulating layer 176 also reduces particles and other contaminants from molding area 178 during singulation.

Figure 7A:
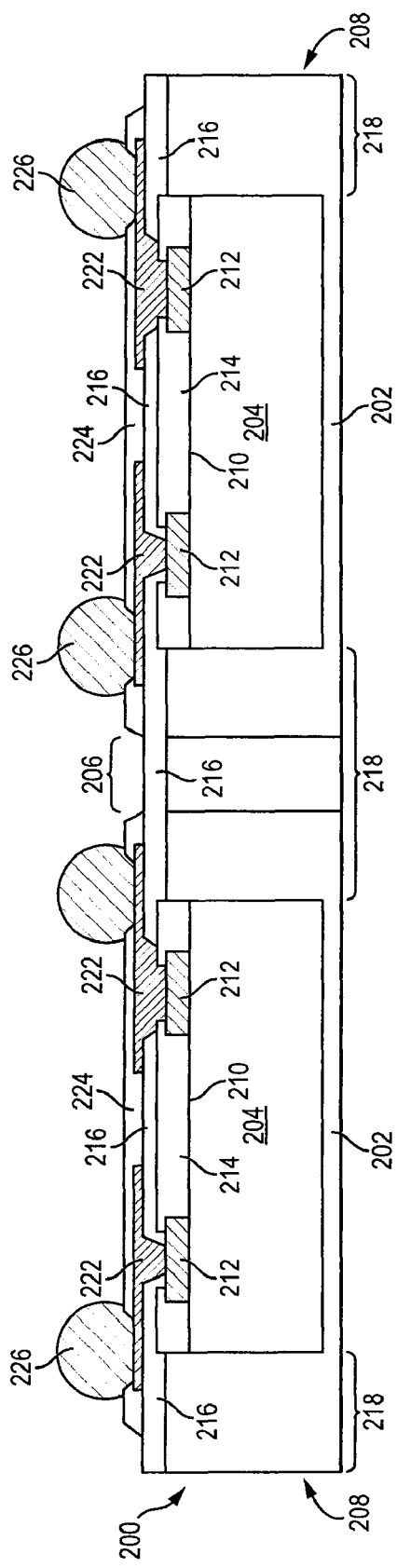
FIGS. 7a-7c illustrate an insulating layer fully over the saw street and around the substrate edge.
Figure 7C:
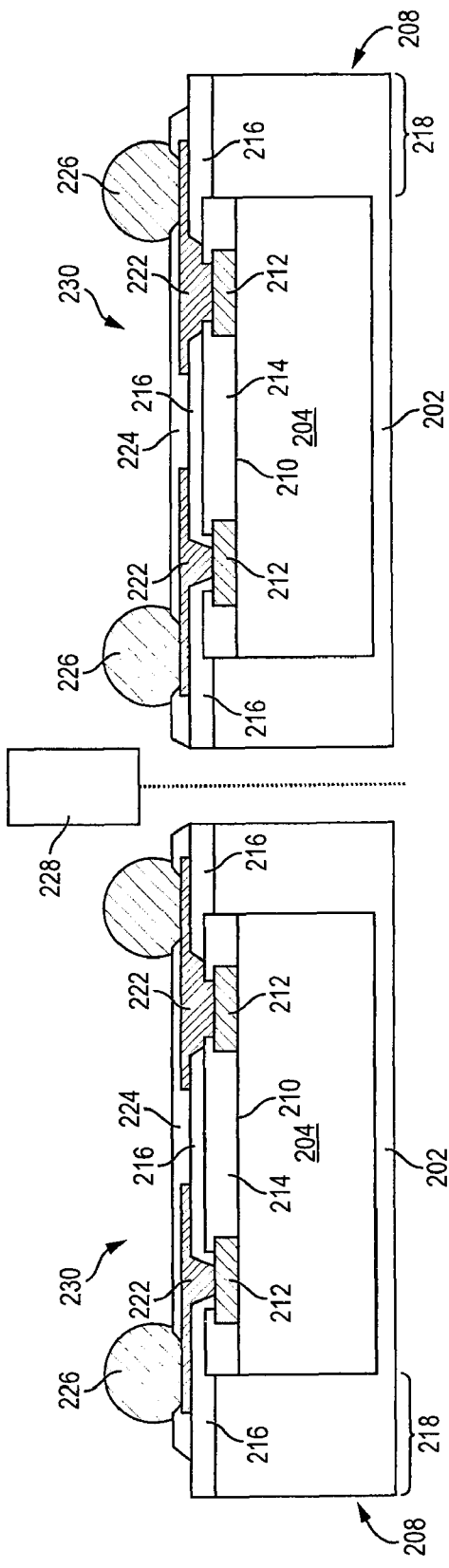
Figure 7B:
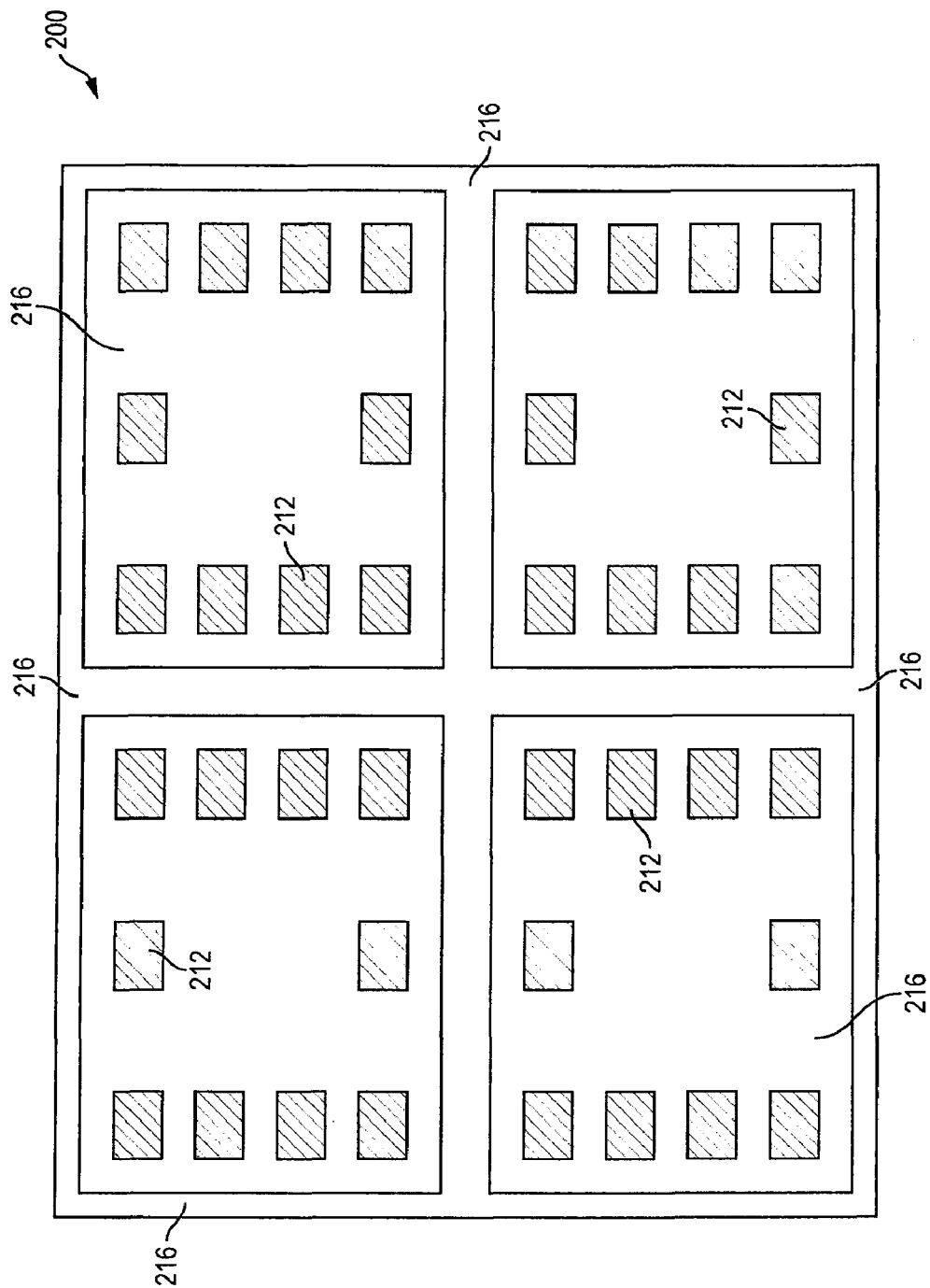

FIGS. 7a-7c illustrate, in relation to FIGS. 2 and 3a-3c, a process of forming an insulating layer with full coverage over the saw street and around the substrate edge. FIG. 7a shows substrate 200 with embedded semiconductor die 204, similar to FIG. 4c. Semiconductor die 204 have an active surface 210 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 210 to implement analog circuits or digital circuits, such as DSP, ASIC, memory, or other signal processing circuit. Semiconductor die 164 may also contain IPDs, such as inductors, capacitors, and resistors, for RF signal processing.

An electrically conductive layer 212 is formed over active surface 210 using patterning and PVD, CVD, electrolytic plating, electroless plating process, or other suitable metal deposition process. Conductive layer 212 can be one or more layers of Al, Cu, Sn, Ni, Au, Ag, or other suitable electrically conductive material. Conductive layer 212 operates as contact pads electrically connected to the circuits on active surface 210.

An insulating or dielectric layer 214 is formed over active surface 210 and contact pads 212 using PVD, CVD, printing, spin coating, spray coating, or thermal oxidation. The insulating layer 214 can be one or more layers of SiO2, Si3N4, SiON, Ta2O5, Al2O3, polyimide, BCB, PBO, or other suitable dielectric material. A portion of insulating layer 214 is removed by an etching process to expose contact pads 212.

An insulating or passivation layer 216 is formed with full coverage over semiconductor wafer 200 by PVD, CVD, printing, spin coating, spray coating, or thermal oxidation.

The insulating layer 216 can be one or more layers of SiO2, Si3N4, SiON, Ta2O5, Al2O3, or other material having similar insulating and structural properties. In particular, insulating layer 216 covers contact pads 212, insulating layer 214, molding area 218, substrate edge 208, and saw street 206 designated for interconnect fan-out. A portion of insulating layer 216 is removed by an etching process to expose contact pads 212. FIG. 7b is a top view of insulating layer 216 fully covering semiconductor wafer 200, including molding area 218, saw street 206, and substrate edge 208.

An electrically conductive layer 222 is formed over insulating layer 216 and contact pads 212 using patterning and PVD, CVD, electrolytic plating, electroless plating process, or other suitable metal deposition process. Conductive layer 222 can be one or more layers of Al, Cu, Sn, Ni, Au, Ag, or other suitable electrically conductive material. Conductive layer 222 is electrically connected to contact pads 212 and operates as an RDL to extend the electrical connectivity of the contact pads.

An insulating or passivation layer 224 is formed over insulating layer 216 and RDL 222 by PVD, CVD, printing, spin coating, spray coating, or thermal oxidation. The insulating layer 224 can be one or more layers of SiO2, Si3N4, SiON, Ta2O5, Al2O3, or other material having similar insulating and structural properties. A portion of insulating layer 224 is removed by an etching process to expose RDL 222.

An electrically conductive bump material is deposited over RDL 222 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to RDL 222 using a suitable attachment or bonding process. In one embodiment, the bump material is reflowed by heating the material above its melting point to form spherical balls or bumps 226 extending at least partially over molding area 218. In some applications, bumps 226 are reflowed a second time to improve electrical contact to RDL 222. The bumps can also be compression bonded to RDL 222. Bumps 226 represent one type of interconnect structure that can be formed over RDL 222. The interconnect structure can also use bond wires, stud bump, micro bump, or other electrical interconnect.

In FIG. 7c, semiconductor wafer 200 is singulated through insulating layer 216 and saw street 206 using saw blade or laser cutting tool 228 to separate the individual semiconductor die 204 into FO-WLCSP 230, similar to FIG. 5. Saw blade or laser cutting tool 228 can use a single cut or step cut. Contact pads 212, RDL 222, and bumps 226 provide electrical connection to the circuits on active surface 210. The insulating layer 216 is formed prior to RDL 222 and fully covers saw street 206 and substrate edge 208. The insulating layer 216 improves contact resistance in PVD for fan-out edge pads and plasma stability during oxide etching. The insulating layer 216 also reduces particles and other contaminants from molding area 218 during singulation.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device, comprising:
   providing a carrier;
   mounting a plurality of semiconductor die with contact pads oriented to the carrier;
   depositing an encapsulant over the semiconductor die and carrier, wherein a portion of the encapsulant is designated as a saw street between the semiconductor die and a portion of the encapsulant is designated as a substrate edge around a perimeter of the encapsulant;
   removing the carrier to expose a surface of the encapsulant;
   forming a first insulating layer over the semiconductor die and directly on the saw street and substrate edge;
   forming a conductive layer over the first insulating layer and contacting the semiconductor die;
   forming a second insulating layer over the conductive layer and first insulating layer; and
   singulating the encapsulant through the first insulating layer and saw street to separate the semiconductor die.

2. The method of claim 1, further including forming the first insulating layer to cover a molding area around the semiconductor die.

3. The method of claim 2, further including forming the first insulating layer to cover the entire saw street and molding area.

4. The method of claim 1, further including forming a channel in the first insulating layer on opposing sides of the saw street.

5. The method of claim 1, further including forming a channel in the first insulating layer along the substrate edge.

6. The method of claim 1, further including forming the first insulating layer in a net pattern to cover the saw street and substrate edge.

7. The method of claim 1, further including forming a bump over the conductive layer.

8. A method of manufacturing a semiconductor device, comprising:
   providing a carrier;
   mounting semiconductor die to the carrier;
   depositing an encapsulant over the semiconductor die and carrier, wherein a portion of the encapsulant is designated as a saw street between the semiconductor die;
   removing the carrier to expose a surface of the encapsulant;
   forming a first insulating layer over the semiconductor die and directly on the saw street;
   forming a conductive layer on the semiconductor die and over the first insulating layer;
   forming a second insulating layer over the conductive layer and first insulating layer; and
   singulating the encapsulant through the first insulating layer and saw street.

9. The method of claim 8, wherein a portion of the encapsulant is designated as a substrate edge around a perimeter of the encapsulant.

10. The method of claim 9, further including forming a channel in the first insulating layer along the substrate edge.

11. The method of claim 9, further including forming the first insulating layer in a net pattern to cover the saw street and substrate edge.

12. The method of claim 8, further including forming the first insulating layer to cover a molding area around the semiconductor die.

13. The method of claim 12, further including forming the first insulating layer to cover the entire saw street and molding area.

14. The method of claim 8, further including forming a channel in the first insulating layer on opposing sides of the saw street.

15. A method of manufacturing a semiconductor device, comprising:
   providing a plurality of semiconductor die;
   depositing an encapsulant over the semiconductor die, wherein a portion of the encapsulant is designated as a saw street between the semiconductor die;
   forming an insulating layer over the semiconductor die and directly on the encapsulant;
   forming a redistribution layer (RDL) over the insulating layer; and
   singulating the encapsulant through the insulating layer and saw street.

16. The method of claim 15, wherein a portion of the encapsulant is designated as a substrate edge around a perimeter of the encapsulant.

17. The method of claim 16, further including forming a channel in the insulating layer along the substrate edge.

18. The method of claim 16, further including forming the insulating layer in a net pattern to cover the saw street and substrate edge.

19. The method of claim 15, further including forming the insulating layer to cover the entire saw street and a molding area around the semiconductor die.

20. The method of claim 15, further including forming a channel in the insulating layer on opposing sides of the saw street.

21. A method of manufacturing a semiconductor device, comprising:
   providing a plurality of semiconductor die;
   depositing an encapsulant around the semiconductor die;
   forming an insulating layer directly on and in contact with the encapsulant;
   forming a conductive layer over the insulating layer; and
   singulating the encapsulant through the insulating layer.

22. The method of claim 21, further including:
   forming a first channel in the insulating layer;
   forming a second channel in the insulating layer; and
   singulating the encapsulant through the insulating layer between the first and second channels in the insulating layer.

23. The method of claim 21, further including:
   forming a first net pattern in the insulating layer;
   forming a second net pattern in the insulating layer; and
   singulating the encapsulant through the insulating layer between the first and second net patterns in the insulating layer.

24. The method of claim 21, further including singulating the encapsulant using a step cut.

* * * * *